United States Patent [19]

Hayashi et al.

[11] Patent Number: 5,409,892
[45] Date of Patent: Apr. 25, 1995

[54] METHOD OF MAUFACTURING SUPERCONDUCTOR OF CERAMICS SUPERCONDUCTIVE MATERIAL

[75] Inventors: Kazuhiko Hayashi; Hisao Nonoyama; Misayuki Nagata, all of Osaka, Japan

[73] Assignee: Sumitomo Electric Industries, Ltd., Osaka, Japan

[21] Appl. No.: 140,382

[22] Filed: Oct. 21, 1993

Related U.S. Application Data

[63] Continuation of Ser. No. 700,350, May 7, 1991, abandoned, which is a continuation of Ser. No. 358,909, May 30, 1989, abandoned.

[30] Foreign Application Priority Data

| Jun. 2, 1988 | [JP] | Japan | 63-136488 |
| Dec. 20, 1988 | [JP] | Japan | 63-322391 |
| Jan. 10, 1989 | [JP] | Japan | 1-3084 |
| Dec. 27, 1989 | [JP] | Japan | 1-333005 |

[51] Int. Cl.$^6$ ............................................. C30B 13/02
[52] U.S. Cl. ................................. 505/451; 117/41; 117/42; 117/49; 305/729
[58] Field of Search ................. 505/1, 729, 451, 742; 117/41, 42, 49, 50

[56] References Cited

U.S. PATENT DOCUMENTS

| 4,176,002 | 11/1979 | Quenisset et al. | 156/620.74 |
| 4,436,578 | 3/1984 | Keller et al. | 156/620.73 |
| 4,615,760 | 10/1986 | Dressler | 156/620.73 |

OTHER PUBLICATIONS

Torascon et al, "Oxygen Doping of the High Tc Superconducting Perovskites", High Temperature Superconductors, M.R.S. 1987 Spring Meeting of MRS Apr. 23–24, 1987 pp. 65–66.
Wu et al, "Epitaxial Ordering of Oxide Superconductor Thin Films on (100) SrTiO$_3$..." Applied Physics Letters, 51(11) Sep. 14, 1987 pp. 861–863.
Morris et al., "Preparation of High Quality, Single Crystals of 90° k Superconducting YBaCuO", High Temperature Superconductors II, M.R.S. Reno, Nev. Apr. 18, 1988 pp. 43–46.
Trouilleux et al., "Growth and Antisotropic Magnetic Behaviour of Aligned Eutectic Type . . . Copper Oxide", Journal of Crystal Growth, vol. 91 (1988) pp. 268–273.
Tiang et al, "Crystal Growth of Y–Ba–Cu–O Compound by Laser Floating Zone Melting", High Temp. Superconductors (II) M.R.S. Apr. 5–9, 1988 Reno, Nev. pp. 125–128.
Zhang, J. S., et al., "Characteristics of the Crystal Growth and Microstructures of the Y–Ba–Cu–O Compounds by Laser Floating Zone Melting Technique,"
Mayo, William E., Proceedings of the Metallurgical Society/sponsored by Materials Research Society, Processing & Applications of High T Superconductors, May 9–11, 1988.

*Primary Examiner*—Robert Kunemund
*Attorney, Agent, or Firm*—Pennie & Edmonds

[57] ABSTRACT

A method of manufacturing a superconductor by applying a floating zone method to a raw material sintered ingot. This method is adapted to obtain an elongated superconductor which can provide high critical current density. A floating zone is moved along the raw material sintered ingot with such speed difference that the speed in its forward end portion is higher than that in its rear end portion, thereby to obtain a superconductor having a smaller diameter. In order to attain a higher crystal orientation property, it is preferable to select the product of the diameter (D mm) of a superconductor provided with a crystal orientation property, which is produced after passage of the floating zone, and the speed (V mm/h) for moving the floating zone in a range of $0.5 \leq DV \leq 20$ and to select pressure P of an atmosphere encircling the floating zone in a range of $0 < P \leq 3$ [kgf/cm$^2$] as well as to pass the floating zone along the raw material sintered ingot at least twice.

15 Claims, 2 Drawing Sheets

METHOD OF MAUFACTURING SUPERCONDUCTOR OF CERAMICS SUPERCONDUCTIVE MATERIAL

This is a continuation of application Ser. No. 07/700,350, filed May 7, 1991, now abandoned and is a continuation of application Ser. No. 07/358,909, filed May 30, 1989, now abandoned.

BACKGROUND OF THE INVENTION

1. Field of the Invention

The present invention relates to a method of manufacturing a superconductor of a ceramics superconductive material, and more particularly, it relates to a method of manufacturing a superconductor by a floating zone method, i.e., the FZ method.

2. Description of the Background Art

In recent years, a ceramics superconductive material has been watched as a material presenting a higher critical temperature. A superconductor having a desired configuration is obtained from such a ceramics superconductive material generally by a sintering process of compacting a ceramics powder material and then sintering the same. After the compacting step, calcining may be performed in advance of the sintering, as the case may be.

In the aforementioned sintering process, however, manufacturable configurations of the superconductor are limited. Further, a dense superconductor cannot be easily obtained because of voids which are left after sintering. In addition, it is difficult to control the crystal structure of the superconductor in the sintering process. Due to such factors, therefore, it has been impossible to attain high critical current density in the superconductor obtained by the sintering process.

SUMMARY OF THE INVENTION

Accordingly, an object of the present invention is to provide a method of manufacturing a superconductor, which can obtain a dense superconducting phase and oriented crystals in a direction for facilitating flow of superconducting current in order to attain high critical current density at a relatively high temperature such as that of liquid nitrogen, for example.

Another object of the present invention is to provide a method of manufacturing a superconductor, which enables elongation of the superconductor, in order to effectively apply its superconductivity to, for example, a magnet coil.

The present invention provides a method of manufacturing a superconductor of a ceramics superconductive material, which basically comprises a step of melting and solidifying a raw material. More specifically, this step is carried out through the FZ method. First, a sintered ingot of a raw material is prepared. Then, a floating zone having composition for precipitating a superconducting phase from a part of the raw material sintered ingot serving as a primary phase is formed in a part of the raw material sintered ingot. This step is typically started by preparing a sintered body having the composition for precipitating the superconducting phase from the part of the raw material sintered ingot serving as the primary phase, arranging the sintered body to be held between an end of the raw material sintered ingot and a seed crystal member and heating the sintered body for melting the same. A floating zone thus defined is longitudinally moved along the raw material sintered ingot, thereby to produce a grown crystal member provided with a crystal orientation property upon passage of the floating zone.

In the above step of defining a floating zone, the "floating zone having composition for precipitating a superconducting phase from a part of the raw material sintered ingot serving as a primary phase" is defined for the following reason: The inventors have made various experiments to recognize that a material having the same composition as a superconducting phase to be obtained (such as $Y_1Ba_2Cu_3O_x$, for example) causes difficulty in haplodization, for example, due to incongruent melting, and it may be rather easy to obtain a superconducting phase having desired composition in the form of a single phase, for example, by melting a material having composition different from that of the superconducting phase to be obtained. Thus, the aforementioned expression is employed since the floating zone may have the "composition for precipitating a superconducting phase from a part of the raw material sintered ingot serving as a primary phase" as the result.

According to the present invention, crystals of a superconducting phase are regularly precipitated from the floating zone while the raw material is supplied to the floating zone from the raw material sintered ingot to make up for the precipitated crystals. Thus, crystals grown by melting and solidification form a superconducting phase as a single phase, for example. Further, a dense superconductor can be obtained since the crystals are grown through the floating zone. The crystals can be grown in a constant direction, so that the grown crystals form unidirectionally solidified or single crystal structure. In other words, unidirectionally solidified structure is obtained when the floating zone is moved at a relatively high speed, while single crystals are obtained when the same is moved at a relatively low speed.

One of factors determining the length of the obtained superconductor is the length of the raw material sintered ingot. Thus, the superconductor can be easily elongated by increasing the length of the raw material sintered ingot.

When a seed crystal member is employed, crystals can be grown in an arbitrary orientation. Therefore, critical current density as viewed in the direction of crystal growth can be further increased by selecting the direction of crystal growth to be perpendicular to the c-axes of the crystals. The longitudinal direction of the superconductor thus obtained coincides with the direction of crystal growth, whereby large current can flow in the longitudinal direction of the superconductor.

According to the inventive manufacturing method, further, crystal growth is stabilized and superconductivity can be prevented from deterioration caused by contamination with impurities, since no crucible etc. is employed.

DETAILED DESCRIPTION OF THE INVENTION

On the basis of the aforementioned recognition that it may be preferable to positively make difference between composition of the floating zone and that of the superconducting phase to be obtained, the composition of the floating zone is selected as described below when the ceramics superconductive material is formed of at least one (hereinafter referred to as "Ln") of yttrium (Y), lanthanum (La), neodymium (Nd), promethium (Pm), samarium (Sm), europium (Eu), gadolinium (Gd), dysprosium (Dy), holmium (Ho), erbium (Er), thulium (Tm), ytterbium (Yb) and lutetium (Lu), barium, copper and oxygen. The composition is selected within a region enclosed by a triangle linking a first point showing 100 at. % CuO, a second point at which Ln, Ba and Cu are in the ratios 1:2:3 and a third point at which Ln, Ba and Cu are in the ratios 0:1:1 in a three-component composition diagram of $LnO_{1.5}$, BaO and CuO, which are oxides of Ln, barium and copper respectively.

A superconducting phase expressed in $Ln_{1+2x}Ba_{2(1-x)}Cu_3O_y$ ($0 \leq x \leq 0.4$, $6 \leq y \leq 7$) is precipitated as a primary phase when the aforementioned specific composition is applied. Such an Ln—Ba—Cu superconducting phase has a certain composition range, as hereinabove described. Therefore, crystals of a superconducting phase can be precipitated even if superconducting crystals precipitated from the floating zone are slightly unbalanced with the material supplied to the floating zone from the raw material sintered ingot. In other words, the speed for moving the floating zone, i.e., the speed for growing the crystals can be increased.

According to the present invention, oxygen pressure is preferably provided for carrying out the step of moving the floating zone, so that the floating zone causes no bubble.

Such oxygen pressure is provided for the following reason: In general, a molten oxide releases excessive oxygen in the form of bubbles since the amount of oxygen is reduced as compared with that in a solid state. That is, balanced relation of $MO_x$ (solid)$\rightleftarrows MO_{x-y}$ (liquid)$+O_y$ (gas) holds. In a liquid state, therefore, oxygen of $O_y$ is generated to form bubbles. Such bubbles instabilize the floating zone, and hence crystal growth is instabilized to irregularize the crystal structure. Consequently, critical current density is reduced. However, if atmosphere oxygen pressure is increased, the balance in the above expression is leftwardly advanced to suppress the bubbles.

After the step of moving the floating zone, it is preferable to hold a part provided with a crystal orientation property, i.e., a grown crystal part in an atmosphere having oxygen partial pressure of at least 0.2 atm. in a temperature range of 800° to 950° C. for at least two hours and thereafter cool the same at a cooling rate of not more than 200° C./h.

The aforementioned preferred embodiment has an effect of making sufficient absorption of oxygen into the superconductor and improving the critical temperature of the superconductor although oxygen contents of the crystals as grown are small. It has been recognized that, in the composition of $Ln_{1+2x}Ba_{2(1-x)}Cu_3O_y$ ($6 \leq y \leq 7$), for example, the critical temperature is similar to that of a semiconductor material when $y=6$, around 60° K. when $y=6.5$ and around 90° K. when $y=6.8$ to 7. According to this preferable manufacturing method, therefore, oxygen can be sufficiently absorbed so that $y=6.8$ to 7, thereby to obtain a superconductor having a critical temperature of about 90° K. Such a cooling step may be carried out in continuation to the crystal growth operation by providing an after heater, for example, or the temperature may be raised up again after temporary reduction to the room temperature.

In the step of moving the floating zone, the floating zone may be longitudinally provided with such speed difference that the speed in its forward portion is higher than that in its rear portion.

According to the aforementioned preferred embodiment, the obtained superconductor can be reduced in diameter as compared with the raw material sintered ingot. Thus, the superconductor can be further easily elongated.

The present invention may be advantageously applied to various ceramics superconductive materials of Bi and any other systems, in addition to the aforementioned Y system. Of the Bi system superconductive materials, the present invention is advantageously applied to those of Bi—Sr—Ca—Cu—O and Bi—Pb—Sr—Ca—Cu—O systems, in particular.

In order to attain high critical current density and a preferable crystal orientation property, the inventors have found that there is prescribed relation between the diameter of a grown superconductor and the speed of growth, which relation can be limited under prescribed conditions, thereby to obtain a preferable result. That is, the product of the diameter (D mm) of a grown superconductor and the speed (V mm/h) of growth is preferably selected within a range of $0.5 \leq DV \leq 20$. When the superconductor is grown, the raw material sintered ingot and the grown crystal part are preferably reversely rotated within a range of 0.1 to 40 r.p.m.

The reason for the aforementioned restriction of each technical constituent feature is as follows:

The product of the grown crystal diameter D [mm] and the speed V [mm] of growth is limited within the range of $0.5 \leq DV \leq 20$ for the following reason: Important factors for orienting grown crystals are a temperature gradient in a solidification interface and a speed of growth, and the speed of growth is particularly noted according to the present invention. The inventors have experimentally found that a speed of growth for providing a preferable orientation property is deeply related with the grown crystal diameter, and restricted the above condition. If the value of DV is greater than 20, for example, it is difficult to attain a preferable orientation property over the entire grown crystals although the grown crystals may be partially oriented. Further, crystal growth itself may be difficult if the value of V is too high. When the value of DV is less than 0.5, on the other hand, crystal growth itself is difficult. Further, an excessively slow speed V of growth is industrially meaningless in consideration of productivity.

The grown crystal part and the raw material sintered ingot are reversely rotated in the range of 0.1 to 40 r.p.m. for the following reason: If the crystal diameter is larger, a temperature gradient is caused between the surface and central portion of a floating zone and hence it is impossible or difficult to grow the crystal in parallel with the direction of crystal growth. When the grown crystal part and the raw material sintered ingot are reversely rotated as hereinabove described, stirring is caused in the floating zone to uniformalize or substantially uniformalize temperature distribution as viewed in a cross-sectional direction of the floating zone, thereby to improve the crystal orientation property. If the speed of rotation exceeds 40 r.p.m., excessive stirring is caused in the floating zone to irregularize crystal growth, and hence the orientation property is undesirably deteriorated. The speed of rotation may be reduced when the crystal diameter is small, while a temperature gradient is cross-sectionally caused in the floating zone to deteriorate the crystal orientation property when the speed of rotation is less than 0.1 r.p.m., even if the crystal diameter is small and the floating zone is uniformly heated over the entire periphery.

According to the present invention, the floating zone is defined in and passed along the raw material sintered ingot. Such a floating zone may be passed along the raw material sintered ingot at least twice.

When the floating zone method is applied to manufacturing of a superconductor having a crystal orientation property, the orientation property of the grown crystals can be further improved by repeatedly passing the floating zone along the raw material sintered ingot as hereinabove described, thereby to obtain a superconductor having higher critical current density. It has been recognized that the orientation property is further improved to attain higher critical current density by increasing the number of times of such passage of the floating zone. Further, it has been experimentally confirmed that improvement of the orientation property is substantially saturated when the number of times of such passage of the floating zone exceeds 10, and substantially no improvement of the critical current density is attained in this case. Therefore, it is preferable to pass the floating zone at least twice and not more than 10 times in practice.

Finer crystals can be grown from the raw material sintered ingot by providing the floating zone with speed difference along the direction of passage so that the speed in its forward portion is higher than that in its rear portion, i.e., by supplying the raw material to the floating zone at a speed lower than that of crystal growth (speed for moving the floating zone) every time the floating zone is repeatedly passed along the raw material sintered ingot. Further, a finer elongated wire rod or fiber member can be easily manufactured while improving the crystal orientation property by repeating such operation. As hereinabove described, the degree of orientation and critical current density can be sufficiently improved in practice by passing the floating zone not more than 10 times. In order to obtain a finer wire rod or fiber member, however, the number of times of such passage may be arbitrarily set to exceed 10, for example, in response to the degree of reduction in diameter to be attained.

The inventors have found that the pressure of an atmosphere encircling the floating zone is closely related to improvement in critical current density and a preferable crystal orientation property, and that preferable results can be obtained by limiting the atmosphere pressure in a prescribed range.

In more concrete terms, the inventors had generally made an experiment of growing crystals by placing a raw material sintered ingot and a seed crystal rod in an airtight transparent silica tube and providing a floating zone therebetween under the atmospheric pressure, i.e., gage pressure of 0 kgf/cm$^2$. However, although the floating zone method has been employed in order to improve the crystal orientation property, it has generally been impossible to attain sufficient crystal orientation through crystal growth under the atmospheric pressure, while crystal orientation has been frequently mismatched with the direction of movement of the floating zone.

The aforementioned technical problem can be solved by applying prescribed conditions to the pressure of the atmosphere encircling the floating zone. In more concrete terms, the atmosphere pressure P is set in a range of $0 < P \leq 3$ [kgf/cm$^2$]. The atmosphere encircling the floating zone is preferably prepared by oxygen or a mixture of oxygen and inert gas.

In more concrete terms, an oxygen gas bomb and an argon gas bomb, for example, are connected to an airtight silica tube through a pressure reducing valve so that the atmosphere pressure P encircling the floating zone is in the range of $0 < P \leq 3$ [kgf/cm$^2$], thereby to pressurize the floating zone with pressure exceeding the atmospheric pressure, in order to manufacture an oxide superconductor through the floating zone method.

Incidentally, the aforementioned pressure P, which is defined by the gage pressure, is equal to zero in the case of the atmospheric pressure.

It can be assumed that, according to this embodiment, density of the floating zone is improved to improve density of a solidified part since the atmosphere encircling the floating zone is under high pressure, thereby to improve the crystal orientation property.

In this embodiment, the atmosphere pressure is set in the range of $0 < P \leq 3$ [kgf/cm$^2$] for the following reason: If the atmosphere pressure P exceeds 3 kgf/cm$^2$, it is difficult to maintain the floating zone and crystal growth may be impossible. If the atmosphere pressure P is 0 kgf/cm$^2$, i.e., at the atmospheric pressure crystal growth may be mismatched with the direction of movement of the floating zone as hereinabove described, and hence it is impossible to stably manufacture an oxide superconductor having a desired crystal orientation property. If crystals are grown under the atmosphere pressure P of less than 0 kgf/cm$^2$, i.e., in vacuum, a larger number of bubbles are caused in the floating zone, which is solidified with such bubbles, whereby spaces are defined in grain boundaries etc., and it is impossible to attain high critical current density.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
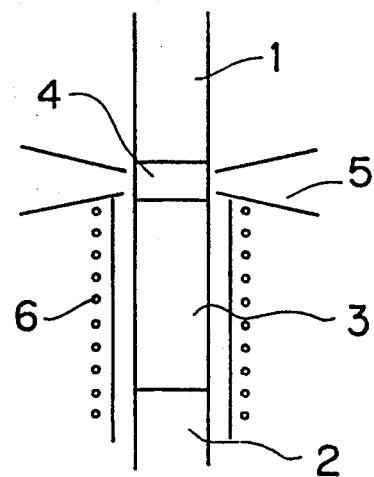
FIG. 1 is a front elevational view schematically showing an apparatus for carrying out an embodiment of the present invention.

A preferred embodiment of the present invention is carried out through an apparatus shown in FIG. 1. Referring to FIG. 1, a raw material sintered ingot 1 and a seed crystal member 2 are in the same composition such as $Ln_{1+2x}Ba_{2(1-x)}Cu_3O_y$ ($0 \leq x \leq 0.4$, $6 \leq y \leq 7$), for example. As to the raw material sintered ingot 1 and the seed crystal member 2, composition ratios of the metal elements may be within the aforementioned ranges, and oxygen may be insufficient. Further, the seed crystal member 2 preferably has the same crystal orientation as a superconductor to be obtained, i.e., a grown crystal member 3. However, the seed crystal member 2 may be prepared from a polycrystalline substance, since the grown crystal member 3 may be provided with prescribed crystal orientation with progress in crystal growth.

Figure 2:
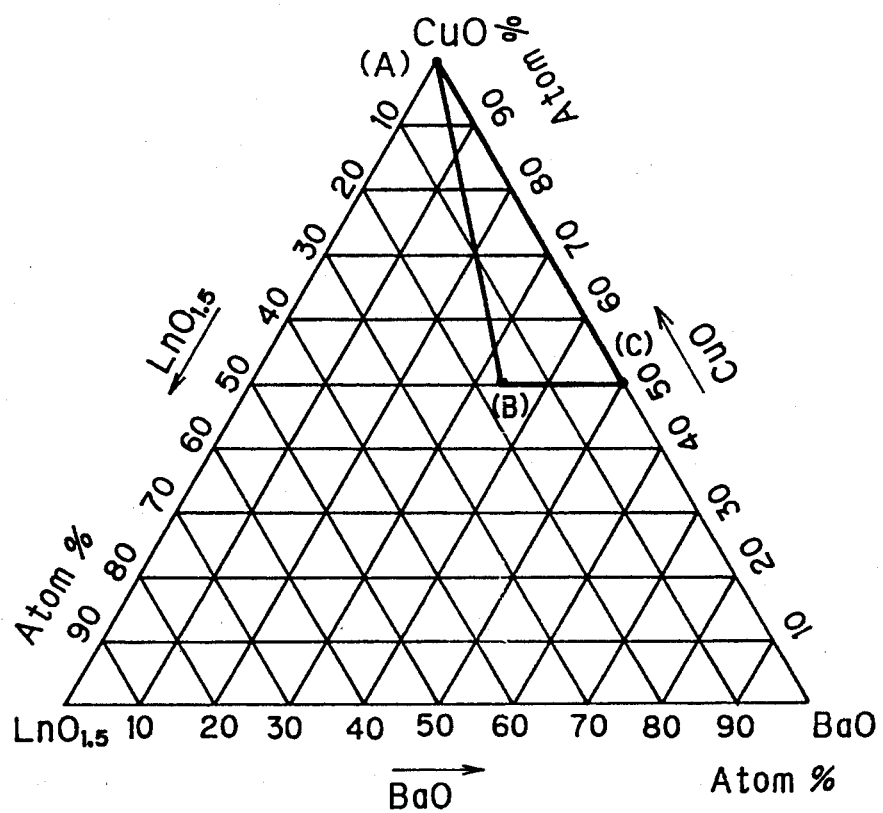
FIG. 2 is a three-component composition diagram showing a preferable composition range of a floating zone employed in the present invention.

A floating zone 4 is shown between the raw material sintered ingot 1 and the grown crystal member 3 and supported by surface tension thereof. The composition of the floating zone 4 is mismatched with that of the grown crystal member 3 to be obtained, and selected within a region enclosed by a triangle linking a first point (A) showing 100 at. % CuO, a second point (B) at which Ln, Ba and Cu are in the ratios 1:2:3 and a third point (C) at which Ln, Ba and Cu are in the ratios 0:1:1 in a three-component composition diagram of $LnO_{1.5}$, BaO and CuO as shown in FIG. 2. Centralized heating with infrared rays 5 is employed in order to define the floating zone 4. It can be said that such centralized heating with the infrared rays 5 is particularly suitable for carrying out the present invention since the same can be applied whether the substance to be molten is an oxide or an insulator and even if the floating zone 4 is defined in an oxidizing atmosphere. Length t of the floating zone 4 and length L of the raw material sintered ingot 1 are preferably selected to be in relation $L/t \geq 10$. It has been recognized that the grown crystal member 3 can be more easily monocrystallized by such selection.

The raw material sintered ingot 1 and the seed crystal member 2 are preferably reversely rotated about respective central axes thereof, thereby to reduce radial temperature difference of the floating zone 4.

The floating zone 4 is moved at a low speed longitudinally along the raw material sintered ingot 1 in a direction away from the seed crystal member 2. Therefore, the raw material sintered ingot 1 and the seed crystal member 2 are downwardly moved in FIG. 1 when the infrared rays 5 are applied in constant positions. Alternatively, the infrared rays 5 may be upwardly moved.

An after heater 6 is provided to heat the grown crystal member 3 provided with a crystal orientation property, which is defined after passage of the floating zone 4. This after heater 6 is adapted to hold the grown crystal member 3 in an atmosphere having oxygen partial pressure of at least 0.2 atm. within a temperature range of 800° to 950° C. for at least two hours. The grown crystal member 3 held by the after heater 6 within the aforementioned temperature range for the aforementioned period is thereafter cooled at a cooling rate of not more than 200° C./h.

The atmosphere for the crystal growth operation shown in FIG. 1 is provided with oxygen pressure to cause no bubble in the floating zone 4, for the aforementioned reason. While required oxygen pressure is varied with the composition and the temperature of the floating zone 4, the atmosphere is provided with oxygen pressure of at least 3 atm., for example.

The apparatus shown in FIG. 1 may be arranged in a vertically inverted manner.

More concrete Examples of the present invention are now described.

EXAMPLES 1 TO 12 AND REFERENCE EXAMPLES 1 TO 3

The apparatus shown in FIG. 1 was employed to grow crystals under the following conditions:

Raw Material Sintered Ingot 1: 3 mm in diameter
Infrared Rays 5: converged from a halogen lamp
After Heater 6: 900° C. in central temperature
Speed of Growth (Speed for Moving Floating Zone 4): 2 mm/h
Speed of Rotation of Raw Material Sintered Ingot 1 and Seed Crystal Member 2: 30 r.p.m. (reverse rotation)

Table 1 shows composition of the seed crystal member 2 and that of the floating zone 4 employed for crystal growth under the aforementioned conditions, composition and structure (orientation of growth) of the grown crystal member 3 and density Jc of critical current flowing in the direction of crystal growth under the temperature (77° K.) of liquid nitrogen in each of Examples 1 to 12 and reference examples 1 to 3. As to numerals indicating crystal orientation in Table 1, [001] shows the c-axis direction. The composition of the raw material sintered ingot 1 is identical to that of the seed crystal member 2.

TABLE 1

| | | Seed Crystal | Composition of Floating Zone | Grown Crystal | Structure of Grown Crystal | Jc(at 77 K) |
|---|---|---|---|---|---|---|
| Example | 1 | $Y_1 Ba_2 Cu_3 O_{6.8}$ [100] Crystal | $Y_5 Ba_{30} Cu_{65} O_x$ | $Y_1 Ba_2 Cu_3 O_{6.8}$ | [100] Single Crystal | $4 \times 10^5$ A/cm$^2$ |
| | 2 | $Nd_1 Ba_2 Cu_3 O_{6.7}$ [010] Crystal | $Nd_5 Ba_{20} Cu_{75} O_x$ | $Nd_{1.1} Ba_{1.9} Cu_3 O_{6.8}$ | [010] Unidirectionally | $1 \times 10^5$ A/cm$^2$ |
| | 3 | $Ho_1 Ba_2 Cu_3 O_{6.6}$ Polycrystal | $Ho_{10} Ba_{30} Cu_{60} O_x$ | $Ho_{1.05} Ba_{1.95} Cu_3 O_{6.9}$ | [010] Unidirectionally Solidified Structure | $2 \times 10^5$ A/cm$^2$ |
| | 4 | $Y_{0.5} Gd_{0.5} Ba_2 Cu_3 O_{6.7}$ [100] Crystal | $Y_5 Gd_5 Ba_{20} Cu_{70} O_x$ | $Y_{0.5} Gd_{0.5} Ba_2 Cu_3 O_{6.8}$ | [100] Single Crystal | $9 \times 10^4$ A/cm$^2$ |
| | 5 | $Sm_1 Ba_2 Cu_3 O_{6.5}$ [010] Crystal | $Ba_{40} Cu_{60} O_x$ | $Sm_{1.15} Ba_{1.85} Cu_3 O_{6.9}$ | [010] Unidirectionally Solidified Structure | $1 \times 10^5$ A/cm$^2$ |
| | 6 | $Er_1 Ba_2 Cu_3 O_{6.6}$ Polycrystal | $Er_{10} Ba_{40} Cu_{50} O_x$ | $Er_1 Ba_2 Cu_3 O_{6.9}$ | [100] Unidirectionally Solidified Structure | $9 \times 10^4$ A/cm$^2$ |
| | 7 | $Eu_1 Ba_2 Cu_3 O_{6.7}$ [010] crystal | $Eu_5 Ba_{15} Cu_{80} O_x$ | $Eu_1 Ba_2 Cu_3 O_{6.85}$ | [010] Single Crystal | $2 \times 10^5$ A/cm$^2$ |
| | 8 | $Pm_1 Ba_2 Cu_3 O_{6.9}$ [100] Crystal | $Pm_{10} Ba_{40} Cu_{50} O_x$ | $Pm_1 Ba_2 Cu_3 O_{6.9}$ | [100] Unidirectionally Solidified Structure | $7 \times 10^5$ A/cm$^2$ |
| | 9 | $Dy_1 Ba_2 Cu_3 O_{6.8}$ [010] Crystal | $Dy_{10} Ba_{30} Cu_{60} O_x$ | $Dy_1 Ba_2 Cu_3 O_{6.8}$ | [010] Unidirectionally Solidified Structure | $2 \times 10^5$ A/cm$^2$ |
| | 10 | $Tm_1 Ba_2 Cu_3 O_{6.8}$ [100] Crystal | $Ba_{30} Cu_{70} O_x$ | $Tm_1 Ba_2 Cu_3 O_{6.9}$ | [100] Single Crystal | $3 \times 10^5$ A/cm$^2$ |
| | 11 | $Yb_1 Ba_2 Cu_3 O_{6.9}$ [100] Crystal | $Yb_5 Ba_{30} Cu_{65} O_x$ | $Yb_1 Ba_2 Cu_3 O_{6.9}$ | [100] Single Crystal | $5 \times 10^5$ A/cm$^2$ |
| | 12 | $Lu_1 Ba_2 Cu_3 O_{6.9}$ Polycrystal | $Yb_5 Ba_{20} Cu_{75} O_x$ | $Lu_1 Ba_2 Cu_3 O_{6.9}$ | [100] Unidirectionally Solidified Structure | $4 \times 10^5$ A/cm$^2$ |
| Reference Example | 1 | $Y_1 Ba_2 Cu_3 O_{6.8}$ [100] Crystal | $Y_{20} Ba_{20} Cu_{60} O_x$ | $Y_2 Ba_1 Cu_1 O_5$ $Y_1 Ba_2 Cu_3 O_{6.8}$ | Multiphase Polycrystal | 10 A/cm$^2$ |
| | 2 | $Sm_1 Ba_2 Cu_3 O_{6.7}$ [010] Crystal | $Y_{10} Ba_{50} Cu_{50} O_x$ | No continuous Crystal Growth Attained | — | — |

TABLE 1-continued

| | Seed Crystal | Composition of Floating Zone | Grown Crystal | Structure of Grown Crystal | Jc(at 77 K) |
|---|---|---|---|---|---|
| 3 | $Nd_1 Ba_2 Cu_3 O_{6.7}$ [100] Crystal | $Nd_{30} Ba_{30} Cu_{40} O_x$ | $Nd_2 Ba_1 Cu_1 O_x$ $Nd_1 Ba_2 Cu_3 O_2$, $BaCuO_2$ | Multiphase Polycrystal | No Current Flowed |

EXAMPLE 13

A growth experiment was made in the apparatus shown in FIG. 1 by employing polycrystal members of $Bi_2Sr_2Ca_1Cu_2O_x$ as the raw material sintered ingot 1 and the seed crystal member 2 and forming the floating zone 4 of $Bi_1Sr_1Ca_1Cu_3O_x$ under the following conditions:

Infrared Rays 5: converged from a xenon lamp
After Heater 6: 830° C. in central temperature
Speed of Growth: 3 mm/h
Speed of Rotation of Raw Material Sintered Ingot 1 and Seed Crystal Member 2: 20 r.p.m. (reverse rotation)

Other conditions were identical to those of Examples 1 to 12.

The grown crystal member 3 was unidirectionally solidified with composition of $Bi_2Sr_2Ca_1Cu_2O_x$ in [100] orientation, and critical current density Jc was $5 \times 10^5$ A/cm² in the direction of growth under the temperature of liquid nitrogen. The critical temperature was 85° K.

EXAMPLE 14

The raw material sintered ingot 1, the seed crystal member 2 and the floating zone 4 were prepared from materials identical in composition to those of Example 1 and the floating zone 4 was necked during crystal growth, to continuously grow [100] single crystals of 0.5 mm in diameter at a speed of 80 mm/h. Thus obtained was an elongated superconductor, the critical current density of which was $10^6$ A/cm² at the temperature of liquid nitrogen.

EXAMPLES 15 TO 22 AND REFERENCE EXAMPLES 4 TO 7

Bi—Sr—Ca—Cu—O oxides were employed to prepare raw material sintered ingots (raw material ingots) under conditions shown in Table 2, to grow crystals by a floating zone melting method through convergence/heating with a halogen lamp. In each sample, the raw material sintered ingot and the grown crystal member were reversely rotated at the same speed of rotation shown in Table 2. Table 2 further shows orientation properties of obtained crystals and values of critical current density Jc measured after annealing the samples in the atmosphere at 840° C. for three hours. The values of critical current density Jc were measured under a temperature of 77° K. and magnetic flux density of 0 T.

TABLE 2

| | | Composition of Raw Material Ingot | Grown Diameter [mm] | Speed of Growth [mm/h] | Speed of Rotation [r.p.m.] | Orientation Property | Jc [A/cm²] |
|---|---|---|---|---|---|---|---|
| Example | 15 | $Bi_6 Sr_5 Ca_5 Cu_4 O_n$ | 5 | 4 | 20 | oriented over entire length | $2 \times 10^4$ |
| | 16 | $Bi_2 Sr_2 Ca_2 Cu_3 O_n$ | 10 | 4 | 40 | oriented over entire length | $9 \times 10^3$ |
| | 17 | $Bi_2 Sr_2 Ca_1 Cu_2 O_n$ | 2 | 10 | 30 | oriented over entire length | $3 \times 10^4$ |
| | 18 | $Bi_2 Sr_2 Ca_2 Cu_3 O_n$ | 0.2 | 2.5 | 0.1 | oriented over entire length | $5 \times 10^4$ |
| | 19 | $Bi_2 Sr_2 Ca_1 Cu_2 O_n$ | 1 | 30 | 5 | oriented over entire length | $7 \times 10^3$ |
| | 20 | $Bi_2 Sr_2 Ca_2 Cu_3 O_n$ | 0.5 | 70 | 1 | oriented over entire length | $8 \times 10^3$ |
| | 21 | $Bi_1 Sr_1 Ca_1 Cu_1 O_n$ | 1.5 | 50 | 10 | oriented over entire length | $1 \times 10^4$ |
| | 22 | $Bi_1 Sr_1 Ca_1 Cu_1 O_n$ | 20 | 1 | 20 | oriented over entire length | $2 \times 10^4$ |
| Reference Example | 4 | $Bi_6 Sr_5 Ca_5 Cu_4 O_n$ | 5 | 10 | 10 | partially oriented | 900 |
| | 5 | $Bi_2 Sr_2 Ca_2 Cu_2 O_n$ | 1 | 60 | 5 | cut during growth | — |
| | 6 | $Bi_2 Sr_2 Ca_1 Cu_2 O_n$ | 2 | 0.2 | 20 | no stable floating zone attained | — |
| | 7 | $Bi_2 Sr_2 Ca_2 Cu_3 O_n$ | 5 | 4 | 50 | no orientation | 500 |

As understood from Table 2, reference examples 4 to 7 were inferior in crystal orientation property or incapable of orienting the crystals, while barely measured values of critical current density Jc thereof were extremely low. On the other hand, Examples 15 to 22 according to the present invention had excellent orientation properties and high values of the critical current density Jc.

Figure 3:
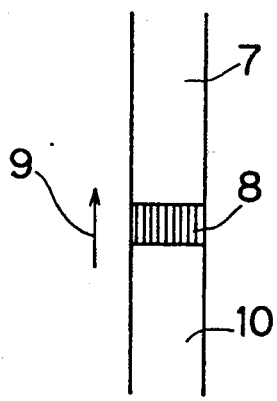
FIG. 3 is a front elevational view showing a state of carrying out another embodiment of the present invention.

FIG. 3 illustrates a state of carrying out another embodiment of the present invention.

A raw material sintered ingot 7 is partially heated to define a floating zone 8. The floating zone 8 is moved at a low speed along an arrow 9, so that a grown crystal member 10 is formed after such passage of the floating zone 8. The direction of movement of the floating zone 8 along the arrow 9 is so relative that the heating zone for defining the floating zone 8 may be moved while fixing the raw material sintered ingot 7 or the latter may be moved while moving the former.

The floating zone 8 is passed at least twice. Assuming that FIG. 3 shows the state of first passage of the floating zone 8, the floating zone 8 is repeatedly passed with respect to the grown crystal member 10 obtained by such passage of the floating zone 8. The floating zone 8 may be regularly unidirectionally passed along the arrow 9, for example, or alternately bidirectionally passed along the arrow 9. Preferable selection of the direction(s) for passing the floating zone 8 depends on the composition of the employed raw material sintered ingot 7. In the floating zone method which has a general effect of removing impurities, the floating zone 8 is preferably unidirectionally passed when such impurities are accumulated in a rear portion of the moved floating zone 8, while the floating zone 8 is preferably reciprocated when the impurities are accumulated in its forward portion.

More concrete Examples carried out according to the method shown in FIG. 3 are now described.

EXAMPLES 23 TO 29 AND REFERENCE EXAMPLE 8

The raw material sintered ingots 7 were prepared from those of 4 mm in diameter having composition of $Bi_2Sr_2Ca_1Cu_2O_x$. Table 3 shows relations between the numbers of passage times of the floating zones 8, the degrees of orientation and values of critical current density Jc under the temperature of liquid nitrogen. The crystals were grown at a speed of 5 mm/h and the floating zones 8 were unidirectionally passed along the arrow 9, for example.

Referring to Table 3, the degrees of orientation are expressed by intensity ratios of (0010) peaks to (115) peaks with perpendicular application of X-rays to the directions of crystal growth. The degrees of orientation are improved with increase in numerical values thereof. Further, all of the values of critical current density Jc were measured after the samples were annealed at 840° C. for three hours.

TABLE 3

| | | Number of Passage Times of Floating Zone | Degree of Orientation | Jc[A/cm$^2$] |
|---|---|---|---|---|
| Example | 23 | 2 | 10 | $5 \times 10^3$ |
| | 24 | 4 | 50 | $2 \times 10^4$ |
| | 25 | 7 | 100 | $9 \times 10^4$ |
| | 26 | 9 | 130 | $2 \times 10^5$ |
| | 27 | 10 | 140 | $3 \times 10^5$ |
| | 28 | 11 | 142 | $3 \times 10^5$ |
| | 29 | 12 | 145 | $3 \times 10^5$ |
| Reference Example | 8 | 1 | 2 | $1 \times 10^3$ |

As understood from Table 3, the degrees of orientation were improved and the values of the critical current density Jc were increased as the numbers of passage times of the floating zones 8 were increased. Comparing Example 27 with Examples 28 and 29, it is understood that the degree of orientation was substantially saturated and no further improvement of the critical current density Jc was attained when the number of passage times of the floating zone 8 exceeded 10. Thus, the number of passage times of the floating zone 8 is preferably not more than 10.

Figure 4:
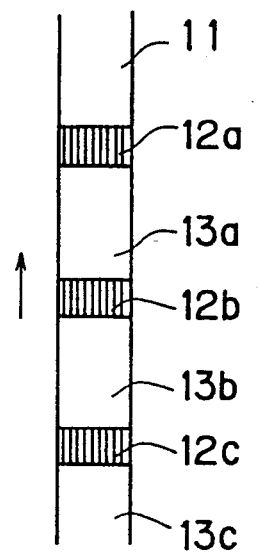
FIG. 4 is a front elevational view showing a state of carrying out still another embodiment of the present invention.

FIG. 4 illustrates a state of carrying out still another embodiment of the present invention.

A plurality of heating zones are simultaneously provided in relation to a raw material sintered ingot 11, thereby to define a plurality of, i.e., three floating zones 12a, 12b and 12c. Therefore, when the floating zones 12a, 12b and 12c are moved to some extent, a grown crystal member 13a is formed after passage of the floating zone 12a and a grown crystal member 13b is formed after passage of the floating zone 12b while a grown crystal member 13c is formed after passage of the floating zone 12c. In the state of first passage of the floating zones 12a, 12b and 12c along the raw material sintered ingot 11 shown in FIG. 4, the final grown crystal member 13c is obtained upon complete passage of the three floating zones 12a, 12b and 12c. Thus, repetitive passage of the plurality of floating zones 12a, 12b and 12c can be more efficiently performed by simultaneously defining the same. Such operation can be repeated also in the case of simultaneously defining the plurality of floating zones 12a, 12b and 12c as shown in FIG. 4.

More concrete Example carried out on the basis of the operation shown in FIG. 4 is now described.

EXAMPLE 30

The raw material sintered ingot 11 was prepared by a sintered ingot of 6 mm in diameter having composition of $Bi_2Sr_2Ca_2Cu_3O_x$. Three floating zones 12a, 12b and 12c were simultaneously defined and passed through the raw material sintered ingot 11 once, thereby to grow crystals. The speed of crystal growth was 5 mm/h.

The degree of orientation and the critical current density Jc of the grown crystal member 13c, which were measured in a similar manner to Examples 23 to 29, were 40 and $3 \times 10^4$ A/cm$^2$ respectively. Another sample of the same raw material sintered ingot was prepared with a single heating zone, and a floating zone thus defined was passed along the raw material sintered ingot once at the same speed of growth. The degree of orientation and the critical current density Jc of this sample were 7 and $3 \times 10^3$ A/cm$^2$ respectively.

From the aforementioned results, it is understood that, as compared with the case of a single floating zone, both of the degree of orientation and the critical current density Jc can be further increased by passing a plurality of floating zones substantially at the same speed of growth (manufacturing speed).

Figure 5:
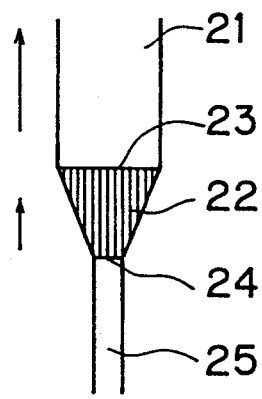
FIG. 5 is a front elevational view showing a state of carrying out a further embodiment of the present invention.

FIG. 5 illustrates a state of carrying out a further embodiment of the present invention.

A floating zone 22, which is defined in a part of a raw material sintered ingot 21, is provided with such speed difference that the speed in its forward portion 23 is higher than that in its rear portion 24 along the direction of passage thereof. Therefore, a grown crystal member 25 formed after passage of the floating zone 22 is smaller in diameter than the raw material sintered ingot 21. The aforementioned speed difference between the forward portion 23 and the rear portion 24 of the floating zone 22 is attained by supplying the raw material to the floating zone 22 at a speed lower than that of crystal growth (speed for moving the floating zone 22). A finer elongated wire rod or fiber member can be easily manufactured while improving the crystal orientation property, by repeating the operation shown in FIG. 5.

More concrete Example carried out on the basis of the operation shown in FIG. 5 is now described.

EXAMPLE 31

The same raw material sintered ingot 21 as that in Example 30 was employed to repeat crystal growth operation five times with the ratio $V_2/V_1$ of the speed $V_1$ for moving the floating zone 22 (speed of growth) to the advanced speed $V_2$ of the raw material sintered ingot 21 in ½. Table 4 shows diameters (D) of grown crystal members 25 thus obtained, the degrees of orientation and values of the critical current density Jc. It was possible to grow the fifth sample of 1 mm in diameter at a speed of 100 mm/h.

TABLE 4

| Number of Passage times | D[mm] | Degree of Orientation | Jc[A/cm$^2$] |
| --- | --- | --- | --- |
| 1 | 4.2 | 5 | $2 \times 10^3$ |
| 2 | 3.0 | 20 | $1 \times 10^4$ |
| 3 | 2.1 | 40 | $2 \times 10^4$ |
| 4 | 1.5 | 60 | $4 \times 10^4$ |
| 5 | 1.0 | 90 | $8 \times 10^4$ |

As understood from Table 4, a finer wire or fiber member can be easily obtained while improving the degree of orientation and the critical current density Jc by repeating passage of the floating zone with speed difference.

EXAMPLES 32 TO 35 AND REFERENCE EXAMPLES 9 AND 10

Raw powder materials of Bi$_2$O$_3$, SrCO$_3$, CaCO$_3$ and CuO were mixed so that Bi, Sr, Ca and Cu were in the mole ratios 2:2:1:2, and the mixture was calcined at 800° C. for 12 hours twice and then at 800° C. for 96 hours. Each sample thus obtained was charged in a rubber tube and formed into a rod of 4 mm in diameter and 15 mm in length by hydrostatic pressing. This compact was sintered at 800° C. for three hours and then at 870° C. for 20 hours, to prepare a raw material sintered ingot in a floating zone furnace. Table 5 shows atmosphere pressure levels in silica tubes during crystal growth.

TABLE 5

| | Atmosphere Pressure [kgf/cm$^2$] | Degree of Orientation | Critical Current Density [A/cm$^2$] | $\left(\dfrac{\text{Apparent Density}}{\text{Theoretical Density}}\right)$ |
| --- | --- | --- | --- | --- |
| Example | | | | |
| 32 | 0.1 | 30 | $5 \times 10^4$ | 92% |
| 33 | 1 | 60 | $1 \times 10^5$ | 95% |
| 34 | 2 | 100 | $3 \times 10^5$ | 98% |
| 35 | 3 | 200 | $8 \times 10^5$ | 100% |
| Reference Example | | | | |
| 9 | 0 | 10 | $1 \times 10^4$ | 80% |
| 10 | 700 mmHg | 3 | $5 \times 10^2$ | 70% |

The atmospheres in the silica tubes were prepared from pure oxygen. The values shown in Table 5 were measured with respect to samples annealed at 840° C. for three hours after crystal growth. The "degrees of orientation" show intensity ratios I(0010)/I(115) of X-ray peaks. The degrees of orientation are evaluated higher as the values are increased. The values of "critical current density" were measured in liquid nitrogen.

EXAMPLE 36

A starting material was prepared by mixing the same raw powder materials as Examples 32 to 35 and reference examples 9 and 10 so that Bi, Sr, Ca and Cu were in the ratios 2:2:2:3, to obtain a raw material sintered ingot through operation similar to that of Examples 32 to 35. Crystal growth was made within a silica tube in an atmosphere of a mixed gas containing O$_2$ and Ar in the ratio 1:4 under total pressure of 2 kgf/cm$^2$. Properties of the sample thus obtained was measured in a similar manner to Examples 32 to 35, to obtain the following results:

Degree of Orientation: 100
Critical Current Density: $2 \times 10^5$ A/cm$^2$
Apparent Density/Theoretical Density: 98%

As understood from Examples 32 to 35 and 36, all of Bi oxide superconductors obtained according to the inventive method were higher in critical current density than reference examples 9 and 10.

EXAMPLE 37

A growth experiment was made in the apparatus shown in FIG. 1 by employing polycrystal members having composition of Bi$_{1.6}$ Pb$_{0.4}$ Sr$_{2.0}$ Ca$_{2.0}$ Cu$_3$ O$_x$ as the raw material sintered ingot 1 of 4 mm in diameter and the seed crystal member 2, in an atmosphere of a mixed gas of Ar and O$_2$ in the ratio 4:1 flowing under total pressure of 2.8 kgf/cm$^2$ in gage pressure, and under the following conditions:

Infrared Rays 5: converged from a halogen lamp
After Heater 6: not heated
Speed of Growth: 1.5 mm/h
Speed of Rotation of Raw Material Sintered Ingot 1 and Seed Crystal Member 2: 30 r.p.m. (reverse rotation)

The Composition of the floating zone 4 was identical to those of the raw material sintered ingot 1 and seed crystal member 2.

The grown crystal member 3 was unidirectionally solidified. Critical temperature Tc was 105° K. and critical current density Jc was $1 \times 10^6$ A/cm$^2$ in the direction of growth under the temperature of liquid nitrogen and no magnetic field from the outside, after annealing in the atmosphere at 850° C. for 200 hours.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a superconductor of a copper oxide based ceramic material, comprising the steps of:
    preparing a raw material sintered ingot;
    defining a floating zone having a composition for crystallizing a superconducting phase as a primary phase wherein the composition of the floating zone is different from that of the final superconducting product;
    melting said floating zone; and
    moving said floating zone along the longitudinal direction of said raw material sintered ingot thereby to provide a crystal orientation property to a part of said ingot upon passage of said floating zone.

2. A method of manufacturing a superconductor in accordance with claim 1, wherein said copper oxide based ceramic material comprises at least one (hereinafter referred to as "Ln") of yttrium, lanthanum, neodymium, promethium, samarium, europium, gadolinium, dysprosium, holmium, erbium, thulium, ytterbium and lutetium, barium, copper and oxygen, and the composition of said floating zone is within a region enclosed by a triangle linking a first point showing 100 at. % CuO, a second point at which Ln, Ba and Cu are in the ratios 1:2:3 and a third point at which Ln, Ba and Cu are in the ratios 0:1:1 in a three component composition diagram of LnO$_{1.5}$, BaO and CuO, which are oxides of Ln, barium and copper respectively.

3. A method of manufacturing a superconductor in accordance with claim 1, wherein oxygen pressure is provided in said step of moving said floating zone so that said floating zone causes no bubble.

4. A method of manufacturing a superconductor in accordance with claim 1, further comprising the step of holding said part provided with a crystal orientation property in an atmosphere having oxygen partial pressure of at least 0.2 atm. within a temperature range of 800° to 950° C. for at least two hours and thereafter cooling the same at a cooling rate of not more than 200° C./h after said step of moving said floating zone.

5. A method of manufacturing a superconductor in accordance with claim 1, wherein said floating zone is provided with such speed difference that the speed in its forward portion is higher than that in its rear portion along said longitudinal direction in said step of moving said floating zone.

6. A method of manufacturing a superconductor in accordance with claim 1, wherein said ceramics superconductive material is an oxide containing Bi, Sr, Ca and Cu.

7. A method of manufacturing a superconductor in accordance with claim 1, wherein said ceramics superconductive material is an oxide containing Bi, Pb, Sr, Ca and Cu.

8. A method of manufacturing a superconductor in accordance with claim 1, wherein the product of the diameter (D mm) of said superconductor provided with a crystal orientation property and the speed (V mm/h) for moving said floating zone is within a range of $0.5 \leq DV \leq 20$ in said step of moving said floating zone.

9. A method of manufacturing a superconductor in accordance with claim 8, wherein said raw material sintered ingot and said superconductor provided with a crystal orientation property are reversely rotated within a range of 0.1 to 40 r.p.m. in said step of moving said floating zone.

10. A method of manufacturing a superconductor in accordance with claim 1, wherein said floating zone is passed along said raw material sintered ingot at least twice in said step of moving said floating zone.

11. A method of manufacturing a superconductor in accordance with claim 10, wherein said floating zone is provided with such speed difference that the speed in its forward portion is higher than that in its rear portion along said longitudinal direction in said step of moving said floating zone.

12. A method of manufacturing a superconductor in accordance with claim 1, wherein pressure P of an atmosphere encircling said floating zone is within a range of $0 < P \leq 3$ in said step of moving said floating zone.

13. A method of manufacturing a superconductor in accordance with claim 12, wherein said atmosphere is prepared from oxygen or a mixture of oxygen and inert gas.

14. A method of manufacturing a superconductor of a copper oxide based ceramic material according to claim 1 wherein said step of defining a floating zone comprises defining said floating zone between said raw material sintered ingot and a seed crystal.

15. A method of manufacturing a superconductor of a copper oxide based ceramic material according to claim 14 wherein said floating zone is formed as a sintered body.

* * * * *